United States Patent [19]

Heinecke et al.

[11] Patent Number: 4,824,690
[45] Date of Patent: Apr. 25, 1989

[54] PULSED PLASMA PROCESS FOR TREATING A SUBSTRATE

[75] Inventors: Rudolf A. H. Heinecke; Suresh M. Ojha; Ian P. Llewellyn, all of Harlow, England

[73] Assignee: Standard Telephones and Cables Public Limited Company, London, England

[21] Appl. No.: 117,923

[22] Filed: Nov. 3, 1987

Related U.S. Application Data

[63] Continuation of Ser. No. 913,590, Oct. 1, 1986, abandoned, Continuation of Ser. No. 706,792, Feb. 28, 1985, abandoned.

[30] Foreign Application Priority Data

Mar. 3, 1984 [GB] United Kingdom ............... 8405647

[51] Int. Cl.⁴ .............................................. B05D 3/06
[52] U.S. Cl. .................................... 427/38; 427/45.1
[58] Field of Search ................ 427/38, 39, 40, 45.1, 427/162, 299, 307, 309, 322, 327, 444; 156/643, 646

[56] References Cited

U.S. PATENT DOCUMENTS

| | | | |
|---|---|---|---|
| 3,108,900 | 10/1963 | Papp | 427/39 |
| 4,382,100 | 5/1983 | Holland | 427/38 |
| 4,422,897 | 12/1983 | Horwitz | 427/38 |
| 4,500,563 | 2/1985 | Ellenberger et al. | 427/38 |
| 4,510,172 | 4/1985 | Ray | 427/38 |
| 4,532,150 | 7/1985 | Endo et al. | 427/38 |

FOREIGN PATENT DOCUMENTS

| | | | |
|---|---|---|---|
| 2051087 | 1/1981 | United Kingdom | 427/40 |
| 2105729 | 3/1983 | United Kingdom | 427/38 |

Primary Examiner—Sadie Childs
Attorney, Agent, or Firm—Kerkam, Stowell, Kondracki & Clarke

[57] ABSTRACT

In a pulsed radio frequency plasma deposition process the pulse repetition frequency is matched to the gas exchange rate. This is achieved by using a pulse width of 50 to 500 microseconds and a pulse repetition rate corresponding to the time within which gas is exchanged in the reaction region.

12 Claims, 1 Drawing Sheet

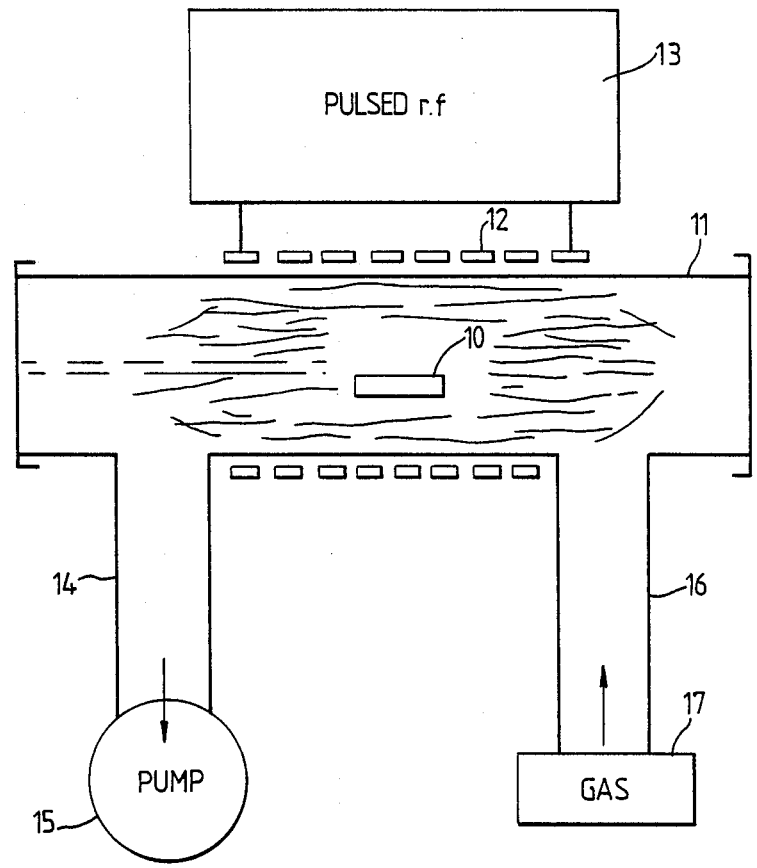

PULSED PLASMA PROCESS FOR TREATING A SUBSTRATE

This is a continuation of application Ser. No. 913,590, filed Oct. 1, 1986 now abandoned which is a continuation of Ser. No. 706,792 filed Feb. 28, 1985 now abandoned.

This invention relates to the deposition from a pulsed radio frequency plasma of surface films on a solid substrate surface.

Plasma processing and in particular low temperature glow discharge plasma processing is potentially a very useful process for the surface processing of substrate materials. As a source of high energy radiation it can promote both physical and chemical changes at the surface of the substrate and can be used for etching, roughening, polymerisation, cross-linking, adhesion promotion, grafting and coating of the surface. It is possible to include more than one of these processes during a treatment so that one can sequentially carry out surface etching, cross-linking and layer or multi-layer deposition of a substrate by simply changing the gas composition. Such a process ensures the maximum possible adherence and compatibility between different deposited layers and avoids other problems such as internal optical reflection caused by abrupt interfaces.

However, the deposition of good inorganic coatings in normal discharges requires substrate temperatures in excess of 250° C. (too high for most plastic substrates for example). The reason for this is probably the relatively low degree of molecular dissociation in the normal discharges. The species arriving at the substrate surface therefore requires additional energy for further decomposition and for structural arrangement of the coating. This has therefore limited the use of plasma in surface processing of many materials and in particular heat sensitive materials such as plastics.

In an attempt to overcome these disadvantages high intensity pulsed radio frequency plasma techniques have been developed. Such a process is described in published UK patent application No. 2105729A (R. A. H. Heinecke-S. M. Ojha-M. J. Cooke 30-2-2). This describes a process for surface processing a heat sensitive substrate material, comprising exposing the surface of the substrate to a high intensity radio frequency pulsed plasma of low average power, the plasma pulse providing a power density of at least a few kW per liter. In general the pulse power is sufficient to achieve substantially full dissociation in the reactant gas.

We have now found that a pulsed plasma deposition process can be optimised by matching the gas exchange rate and the generator pulse repetition rate.

According to the present invention there is provided a process for surface processing of a substrate material, including placing the substrate in a closed chamber, passing a gas through the chamber at reduced pressure, and applying high intensity pulsed radio frequency energy to the chamber to generate a plasma to which the substrate surface is exposed, wherein the pulse repetition frequency corresponds to the rate at which gas is exchanged within the chamber.

The technique substantially eliminates spatial depletion gradients whilst improving the gas utilisation.

An embodiment of the invention will now be described with reference to the accompanying drawing in which the single FIGURE is a schematic diagram of a pulsed plasma deposition apparatus.

Referring to the drawing, a device 10 whose surface is to be coated is mounted within a vacuum chamber 11. That portion of the chamber 11 in which the device 10 is mounted is surrounded by a coil 12 connected to a pulsed radio frequency generator 13. The power output of the generator 13 is not critical but must be sufficient to provide the desired surface deposition. We have found that a 60 kW generator is adequate for this purpose. Typically the pulse power is sufficient to provide an energy density of at least 100 w/cc. Higher energy densities up to 1000 w/cc may be employed to achieve a high degree of excitation of the plasma. The chamber may be evacuated via an outlet 14 leading to a pump 15 and may be supplied with gases or vapours from an inlet manifold 16 via an inlet tube 17.

In use the device 10 is inserted into the chamber 11 which is then evacuated through the outlet 14. If the device has external lead wires these may be masked by attaching masking clips (not shown) prior to the surface treatment. Advantageously a cleaning gas mixture is then admitted to the chamber via the inlet 17 and the generator is switched on to initiate the plasma to provide a clear activated device surface for subsequent film deposition. The cleansing gas may comprise fluorine, oxygen, hydrogen or mixtures thereof, preferably in admixture with helium. The generator may be capacitively or inductively coupled to the chamber.

The gas within the chamber 11 is then changed to a gas or vapour, or mixtures thereof to effect deposition of a surface coating on the device 11. To effect this deposition the pulse repetition rate of the generator is matched to the dissociation rate of the plasma.

To match the pulse rate to the gas exchange rate it is necessary to calculate, from the pumping speed and the chamber volume, the time taken to exchange the gas in the reactor. Optimum matching is obtained when the pulse repetition frequency is equal to this gas exchange time. Typically the partial pressure of the active constituents of the plasma is 10 to 100 m torr. This corresponds to approximately 0.3 to 1 deposited monolayer per pulse.

We have found that the effect of each radio-frequency pulse is to dissociate the plasma gases and thus deplete the active gas content of the chamber 11. Since the length of the pulse is short there is substantially no gas exchange during the pulse. This provides substantially uniform deposition conditions throughout the chamber volume. Immediately after the pulse the chamber contains a substantially uniform plasma in a high degree of dissociation i.e. a high degree of dissociation of the plasma has occurred.

We have found that the dissociation rate of a reactive gas is up to two orders of magnitude slower than the establishment of the plasma, the latter occurring within a few microseconds. To maximise the deposition efficiency the plasma should be maintained for a period of at least 50 microseconds and preferably from 75 to 500 microseconds. We have found that for many plasmas a pulse width of 100 to 400 microseconds provides the optimum deposition condition. The preferred mark space ratio is from 1:300 to 1:1200.

When a first coating process is completed, the gas may, if desired, be evacuated through the outlet 14 and a further gas admitted through the inlet 17 to provide a second processing step. If desired all of the gas may be removed from the chamber 1 before admitting a second gas or alternatively the second gas may be admitted at the same time as the first gas is being removed. In this way two separate surface processing steps may follow one another and if the gases are changed in the second above described manner then there will be no surface discontinuities between the two surface processing steps.

The range of materials to which the process may be applied is not limited. However, the process is particularly suited for the treatment of heat sensitive materials, both organic and inorganic. It may also be used, however, for surface treating other materials such as steel or aluminium.

The gas chosen will depend upon the process required. Atomic species have the advantage of having much higher chemical energies and structural symmetry. Such discharges have further advantages as sources for ultra-violet radiation which will be beneficial to the production of strong cross-linking of plastic surfaces. The article 10 may be made of a wide range of materials including plastics such as acrylics and carbonates. The processing envisaged includes for example surface cleaning and activation of an optical element, application of a graft polymer of matching optical properties, and gradually phasing into wear resistant hard material of high refractive index such as silicon carbide or silicon nitride followed by a quarter wave ($\lambda/4$) inorganic layer of suitable refractive index of, for example, $SiO_2$, and a final layer of thin optically matched water repellant fluorocarbon.

The use of this process is particularly preferred to arrange a moisture impervious layer for, for example infra red lenses or filters, and may be used to coat particles in a fluidised bed arrangement. A magnetic field may be applied to enhance the degree of ionisation. Additional internal and external heating sources may be applied to create the optimum thermal conditions for the article 10.

In certain processes, for example when etching, it may be preferable to place the article 10 outside the active region.

In certain arrangements it may be preferred to pulse the gas supply. In a particular arrangement, the process may be used to provide impermeable coatings for plastics for cables.

Using the technique described herein we have successfully deposited silicon carbide films on plastics substrates. The films were deposited from an equal volume mixture of silane and methane at a pressure of 100 m torr. The generator nominal power employed uses 60 kw, and the pulse width 100$\mu$ sec. at a repetition frequency of 10 Hz. Growth rates of 600 Å/min were observed.

Various modifications of the process may of course be employed. In some applications the reactant gas or gases may be fed into the chamber in a series of pulses, one pulse for each generator pulse. In a further extension of this technique the gas is changed at every pulse to a different composition or to an inert gas. In this way a multilayer structure comprising e.g. a series of monolayers can be formed.

Whilst the technique has been described with particular reference to film deposition it can of course be employed, with a suitable etchant gas mixture, for surface etching of a substrate. The process may for example be employed in the dry etching of a masked semiconductor structure in the fabrication of an integrated circuit.

We claim:

1. In a process for surface treatment of a substrate material wherein the substrate is exposed under reduced pressure to a high intensity pulsed radio frequency plasma, and wherein the plasma pulse repetition frequency corresponds to the rate at which gas is exchanged adjacent the substrate, the improvement comprising:

controlling the partial pressure of the active constituents of the plasma from about 10 to about 100 m torr;

providing a plasma pulse width of 50 to 500 microseconds;

and exposing the plasma to a power density of 100 to 1000 watts/cc such that a high degree of dissociation of the plasma occurs.

2. A process as claimed in claim 1, wherein the plasma pulse width is from 100 to 400 microseconds.

3. A process as claimed in claim 1, wherein said gas is supplied as a series of pulses to said chamber, each gas pulse corresponding to a generator pulse.

4. A process as claimed in claim 3, herein the composition of said gas is changed at each pulse.

5. A process as claimed in claim 1, wherein said gas comprises as etchant.

6. A process as claimed in claim 5, wherein said substrate comprises a semiconductor structure.

7. A process as claimed in claim 1, wherein a surface coating is applied to the substrate surface.

8. A process as claimed in claim 7, wherein said coating comprises a series of monolayers.

9. A process as claimed in claim 8, wherein said substrate comprises an infra-red lens or filter.

10. A process as claimed in claim 7, wherein said coating comprises silicon carbide.

11. A process as claimed in claim 10, wherein said coating is deposited from a mixture of silane and methane.

12. A process as claimed in claim 1, wherein the pulse repetition frequency is from 5 to 10 Hz.

* * * * *

UNITED STATES PATENT AND TRADEMARK OFFICE
CERTIFICATE OF CORRECTION

PATENT NO. : 4,824,690

DATED : April 25, 1989

INVENTOR(S) : Heinecke

It is certified that error appears in the above-identified patent and that said Letters Patent is hereby corrected as shown below:

Col. 4, line 37 (claim 5, line 2) "as" should be --an--.

Signed and Sealed this

Thirteenth Day of March, 1990

Attest:

JEFFREY M. SAMUELS

*Attesting Officer*         *Acting Commissioner of Patents and Trademarks*